United States Patent
Yamamoto

(10) Patent No.: US 7,901,973 B2
(45) Date of Patent: Mar. 8, 2011

(54) SOLID STATE IMAGING DEVICE AND MANUFACTURING METHOD THEREOF

(75) Inventor: Kiyofumi Yamamoto, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 382 days.

(21) Appl. No.: 12/096,005

(22) PCT Filed: Dec. 11, 2006

(86) PCT No.: PCT/JP2006/325130
§ 371 (c)(1),
(2), (4) Date: Jun. 3, 2008

(87) PCT Pub. No.: WO2007/069750
PCT Pub. Date: Jun. 21, 2007

(65) Prior Publication Data
US 2009/0273047 A1 Nov. 5, 2009

(30) Foreign Application Priority Data

Dec. 14, 2005 (JP) .................. 2005-360949
Dec. 15, 2005 (JP) .................. 2005-362325

(51) Int. Cl.
*H01L 21/78* (2006.01)
(52) U.S. Cl. ............. 438/65; 438/68; 438/110; 438/114; 438/458; 438/462; 257/E31.127
(58) Field of Classification Search ............ 438/33, 438/64–65, 6, 106–127, 455–465
See application file for complete search history.

(56) References Cited

U.S. PATENT DOCUMENTS

| 6,770,503 | B1 * | 8/2004 | Marinis et al. .................. 438/48 |
| 6,934,065 | B2 * | 8/2005 | Kinsman ....................... 359/245 |
| 2002/0027284 | A1 | 3/2002 | Ono |
| 2003/0164891 | A1 | 9/2003 | Akimoto |
| 2004/0165098 | A1 | 8/2004 | Ikeda |
| 2004/0188699 | A1 * | 9/2004 | Kameyama et al. ............ 257/99 |
| 2005/0110107 | A1 | 5/2005 | Yamamoto et al. |
| 2005/0212947 | A1 | 9/2005 | Sato et al. |
| 2009/0046183 | A1 * | 2/2009 | Nishida et al. ................. 348/294 |
| 2009/0053850 | A1 * | 2/2009 | Nishida et al. .................. 438/64 |
| 2009/0147115 | A1 * | 6/2009 | Tanida et al. .................. 348/294 |

FOREIGN PATENT DOCUMENTS

| JP | 10-195409 A | 7/1998 |
| JP | 2001-351997 A | 12/2001 |
| JP | 2002-076313 A | 3/2002 |
| JP | 2002-231921 A | 8/2002 |
| JP | 2003/244560 A | 8/2003 |
| JP | 2004-193600 | * 7/2004 |
| JP | 2004-200966 A | 7/2004 |
| JP | 2005-158948 A | 6/2005 |
| JP | 2005-286422 A | 10/2005 |

\* cited by examiner

*Primary Examiner* — Savitri Mulpuri
(74) *Attorney, Agent, or Firm* — Birch, Stewart, Kolasch & Birch, LLP

(57) ABSTRACT

To a transparent substrate (20) on which a plurality of spacers (5) are formed, an infrared cut filter (IRCF) substrate (27) is attached. The IRCF substrate (27) has a coefficient of thermal expansion smaller than the transparent substrate (20) and approximately equal to a wafer (31). Next, the transparent substrate (20) is diced into plural pieces to form a plurality of cover glasses (6). Then heat cure adhesive (32) is coated on each spacer (5) and the spacers (5) are attached on the wafer (31) on which a plurality of light receiving section (3) and pads (10) are previously formed. Finally, the heat cure adhesive (32) is heated to be cured.

4 Claims, 3 Drawing Sheets

SOLID STATE IMAGING DEVICE AND MANUFACTURING METHOD THEREOF

TECHNICAL FIELD

The present invention relates to a solid state imaging device and a manufacturing method thereof, and more particularly to a solid state imaging device of a chip size package type and a manufacturing method thereof.

BACKGROUND ART

To downsize digital cameras, mobile phones and the like, solid state imaging devices incorporated therein are required to be downsized. The conventional solid state imaging devices are formed such that an image sensor chip with a light receiving section is contained in a package of for example a ceramic to be air-tightly sealed. However, recently a solid state imaging device of CSP (Chip Size Package) type is in widespread use. The CSP type solid state imaging device is formed such that a spacer is firstly introduced to surround an outer periphery of a light receiving section on an image sensor chip, and then a transparent cover glass is attached on the spacer to air-tightly seal the light receiving section. Accordingly, the formed solid state imaging device has a small size approximately same as the image sensor chip which is a bare chip.

As a manufacturing method for the CSP type solid state imaging device, a method in which the packaging is completed on a wafer is proposed (for example, see Japanese Patent Laid-Open Publication No. 2002-231921). In this manufacturing method, at first a wafer on which plural light receiving sections are formed and a transparent substrate (material of the cover glass) on which plural spacers are formed are joined such that each spacer surrounds corresponding light receiving section, and then the wafer and the transparent substrate are diced according to the light receiving sections to make the plurality of solid state imaging devices at one time.

By the way, it is desirable to produce as many image sensor chips as possible from a single wafer of defined size. Therefore, the width of sealing for the light receiving section (width of the spacer) is desired to be narrowed to approximately 100 μm. This sealing width of the CSP type solid state imaging device is much narrower than a sealing width of the conventional package which is about 500 μm to 1 mm. To obtain sufficient sealing performance by the narrow sealing width, an appropriate adhesive is needed to be used. As the adhesive for the CSP type solid state imaging device, there are a heat cure adhesive which is cured by application of heat, an UV cure adhesive which is cured by application of UV light, and a room-temperature-cure adhesive which is cured by passage of time at a room-temperature. However, all of them have both advantages and disadvantages.

The heat cure adhesive has a high glass transition point (Tg) and shows good sealing property and good moisture shielding property at high temperature. Since the heat cure adhesive has low reactivity, current leak or other problems do not occur when being used on wiring patterns of the wafer. In addition, since the heat cure adhesive can be cured in a short time, the productivity becomes pretty good.

However, there is a problem that the heat cure adhesive requires the application of heat to be cured. The cover glass of the solid state imaging device is generally made of a low-α-ray glass to prevent photodiodes of the light receiving portion from being destroyed by a-ray. A coefficient of thermal expansion of the low-α-ray glass is approximately 6.7 ppm/° C., which is approximately twice as large as that of the wafer (generally 2 ppm/° C. to 4 ppm/° C.). Accordingly, when the heat cure adhesive is used for joining of the transparent substrate and the wafer, there is a possibility that a warpage of several millimeters is caused in the joined substrates after the substrates are returned to the room temperature from the high temperature, because of a difference of the coefficient of thermal expansion between the two substrates. The warpage possibly breaks the substrates, or adversely affects post-processes even when the substrates are not broken.

The UV cure adhesive has sealing property and moisture shielding property at high temperature, reactivity and cure speed equal to the heat cure adhesive, and does not require the heating process to be cured. Accordingly, the UV cure adhesive is suitable for joining of components including the low-α-ray glass. However, the UV cure adhesive cannot be used for joining of the spacer and the wafer because the spacer is formed of a material such as silicon, which does not transmit UV light.

Since the room-temperature-cure adhesive does not require the application of heat or light to be cured, it can be used to join the wafer and the spacer. However, the room-temperature-cure adhesive has high reactivity, which possibly causes current leak or other problems on wiring patterns of the wafer. Further, since the room-temperature-cure adhesive has low glass transition point (Tg), sealing property and moisture shielding property at high temperature are insufficient. In addition, the room-temperature-cure adhesive requires long time (for example 16 hours) for being cured, and the productivity becomes worse.

In addition, the solid state imaging device produces heat in image capturing operation. Since the coefficient of thermal expansion is different between the image sensor chip and the cover glass, the junctions between the image sensor chip and the spacer and between the spacer and the cover glass possibly come unstuck because of difference of thermal expansion when being heated.

An object of the present invention is to provide a solid state imaging device and a manufacturing method thereof which prevent above-described problems even when the heat cure adhesive and the UV cure adhesive are used in the joining process.

Another object of the present invention is to provide a solid state imaging device and a manufacturing method thereof which prevent the unstuck of the junctions by the heat in the image capturing operation.

DISCLOSURE OF INVENTION

In order to achieve the above object and other objects, a solid state imaging device of the present invention comprises an image sensor chip on which a light receiving section to perform photoelectric conversion is provided, a spacer attached to the image sensor chip for surrounding outer periphery of the light receiving section, a transparent cover glass attached to the spacer for sealing a space surrounded by the spacer, and at least one optical plate attached to the cover glass. The optical plate is formed of an optical function material, such as filtering function, whose coefficient of thermal expansion is approximately the same as the image sensor chip.

It is preferable that the coefficient of thermal expansion of the optical plate is 2 ppm/° C. to 5 ppm/° C., which is approximately equal to that of a typical image sensor chip formed of silicon. In addition, to regulate the thermal expansion of the cover glass by the optical plate and prevent a breakage of joint between each components, it is preferable that the cover glass is a low-α-ray glass whose coefficient of thermal expansion is approximately the same as or larger than the optical plate.

The optical plate is an infrared cut filter, an optical low pass filter, an anti-reflection filter or the like.

It is preferable that the components are joined together by an adhesive having a glass transition point of at least 120° C. Especially, between the spacer and the cover glass and between the cover glass and the optical plate are joined by a UV cure adhesive having a glass transition point of at least 120° C., and between the image sensor and the spacer is joined by a heat cure adhesive having a glass transition point of at least 120° C.

A manufacturing method of the solid state imaging device of the present invention comprises a process for separately sealing plural light receiving sections provided on a wafer and a process for dicing the wafer corresponding to the light receiving sections to make a plurality of image sensor chips. The process for separately sealing the plural light receiving sections includes a process for forming plural spacers on one surface of a transparent substrate which is material of a cover glass such that each spacer corresponds to each light receiving section, a process for joining at least one support substrate to another surface of the transparent substrate before or after the process for forming the spacers. The support substrate is material of optical plates and has a coefficient of thermal expansion approximately the same as the wafer. The process for sealing the light receiving section further includes a process for cutting off the transparent substrate on the support substrate such that portions corresponding to each light receiving section are remained so as to form a plurality of the cover glasses, a process for joining each spacer to the wafer with use of a heat cure adhesive, and a process for dicing the support substrate corresponding to each light receiving section so as to form a plurality of the optical plates.

In addition, the process for joining each spacer to the wafer has a process for coating each spacer with the heat cure adhesive, a process for superimposing each spacer on the wafer, and a process for heating to cure the heat cure adhesive.

According to the solid state imaging device of the present invention, since the optical plate whose coefficient of thermal expansion is approximately equal to the image sensor chip is attached on the cover glass, the thermal expansion of the cover glass is regulated to prevent warpage or breakage in the components of the solid state imaging device due to heat in the image capturing operation. In addition, since the low-α-ray glass for the cover glass has the coefficient of thermal expansion approximately same as or larger than the optical plate, the thermal expansion thereof can be regulated more effectively.

Since the optical plate is the infrared cut filter, the optical low pass filter, the anti-reflection filter or the like, processes and cost for manufacturing the solid state imaging device can be reduced compared to the conventional method. In addition, since the image sensor and the spacer are joined by the heat cure adhesive having the glass transition point of at least 120° C., current leak does not occur and the light receiving section can be properly sealed even in high temperature and high humidity conditions.

According to the manufacturing method of the solid state imaging device of the present invention, since the support substrate having the coefficient of thermal expansion approximately same as the wafer is attached to the transparent substrate and then the transparent substrate is partially cut off on the support substrate to form the cover glasses, the support substrate is rarely affected by the thermal expansion of the cover glass even when the heat cure adhesive is used. Therefore, the cause of warpage or the breakage due to the difference of the coefficient of thermal expansion between the substrates is prevented.

In addition, since the attachment of the single support substrate produces the plurality of the solid state imaging device each of which includes the optical plate such as the infrared cut filter, the productivity can be improved.

BEST MODE FOR CARRYING OUT THE INVENTION

Figure 1:
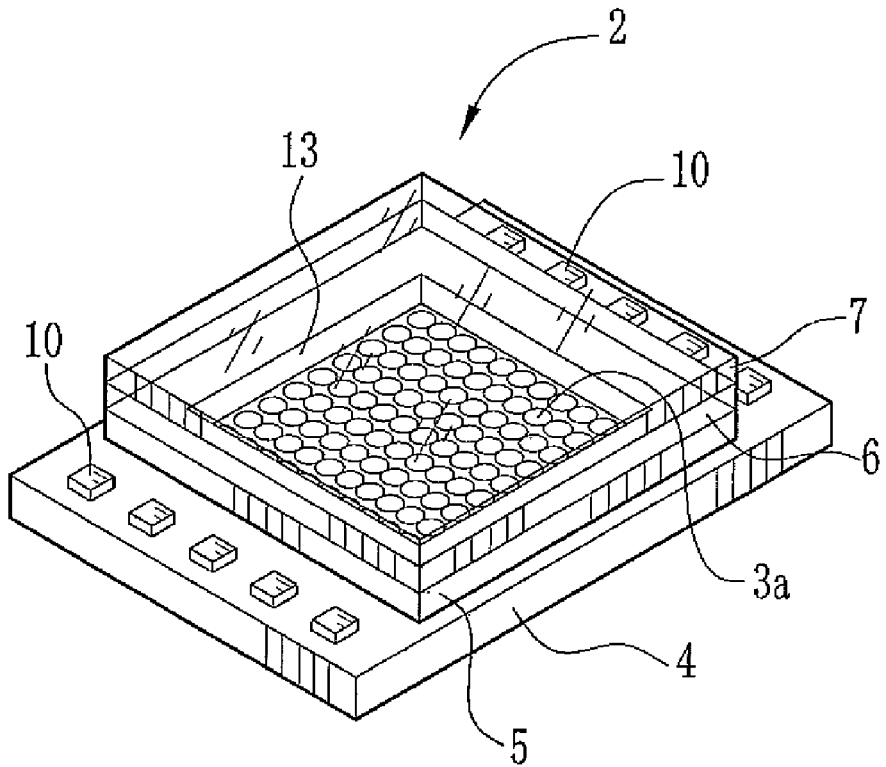
FIG. 1 is a perspective view showing an appearance of a solid state imaging device of the present invention.
Figure 2:
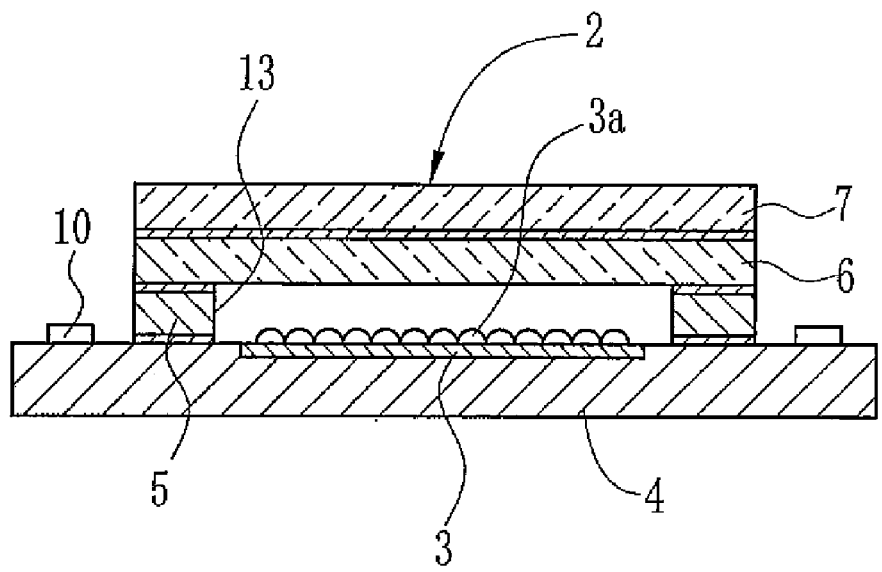
FIG. 2 is a cross-sectional view showing a construction of the solid state imaging device.

A construction of the solid state imaging device of the present invention will be described below. As shown in FIG. 1 and FIG. 2, the solid state imaging device 2 comprises an image sensor chip 4 having an upper surface on which a light receiving section 3 is provided, a frame-like spacer 5 attached on the upper surface of the image sensor chip 4 to surround the light receiving section 3, a transparent cover glass 6 attached on the spacer 5 to seal the light receiving section 3, and an infrared cut filter 7 (as an optical plate) attached on the cover glass 6 to cut infrared light.

The image sensor chip 4 is made by dividing a silicon single crystal wafer into rectangular pieces. On the upper surface of the image sensor chip 4, at the center there is the light receiving section 3 which performs photoelectric conversion, and near two opposite side ends there are plural pads 10 to be connected to a mounting board or the like through wiring. A thickness of the image sensor chip 4 is approximately 300 μm for example, and a coefficient of thermal expansion thereof is 2 ppm/° C. to 4 ppm/° C. for example.

The light receiving section 3 includes a plurality of photodiodes arranged in a matrix and a charge coupled device (CCD) to transfer electric charge accumulated in the photodiodes. The light receiving section 3 is formed on the upper surface of the image sensor chip 4 by a known semiconductor process. On the photodiodes, color filters of RGB (red, green and blue) and a microlens array 3a are attached. Note that a C-MOS image sensor or another type image sensor may be used instead of the CCD image sensor.

The pads 10 are formed of conductive material by pattern formation on the upper surface of the image sensor chip 4. In addition, each pad 10 and the light receiving section 3 are wired by the pattern formation. The solid state imaging device 2 and the mounting board are wired for example by wire bonding.

The spacer 5 has an opening 13 at the center thereof, and is bonded on the upper surface of the image sensor chip 4 to surround the outer periphery of the light receiving section 3. The spacer 5 is formed of inorganic material such as silicon, whose coefficient of thermal expansion is approximately equal to that of the image sensor chip 4. A cross-section of one side of the spacer 5 has approximately 100 μm width and thickness.

The cover glass 6 is bonded on the upper surface of the spacer 5 to seal the opening 13 of the spacer 5. Since a clearance is formed between the cover glass 6 and the light receiving section 3 by the spacer 5, the microlens array 3a does not contact the cover glass 6. As the cover glass 6, a low-α-ray glass which emits only a small intensity of α-ray is used so as to prevent the photodiodes of the light receiving portion 3 from being destroyed by the α-ray. A thickness of the cover glass 6 is approximately 500 μm for example, and a coefficient of thermal expansion thereof is approximately 6.7 ppm/° C. which is larger than that of the image sensor chip 4.

The infrared cut filter 7 is bonded on the cover glass 6 to cut the infrared ray in a predetermined wavelength range so as to prevent a ghost and fogging. The infrared cut filter 7 is for example an optical glass of 500 μm thickness with infrared cut filter (IRCF) coating thereon, and has a coefficient of thermal expansion of approximately 4.5 ppm/° C. which is approximately equal to that of the image sensor chip 4 and smaller than that of the cover glass 6.

Figure 3:
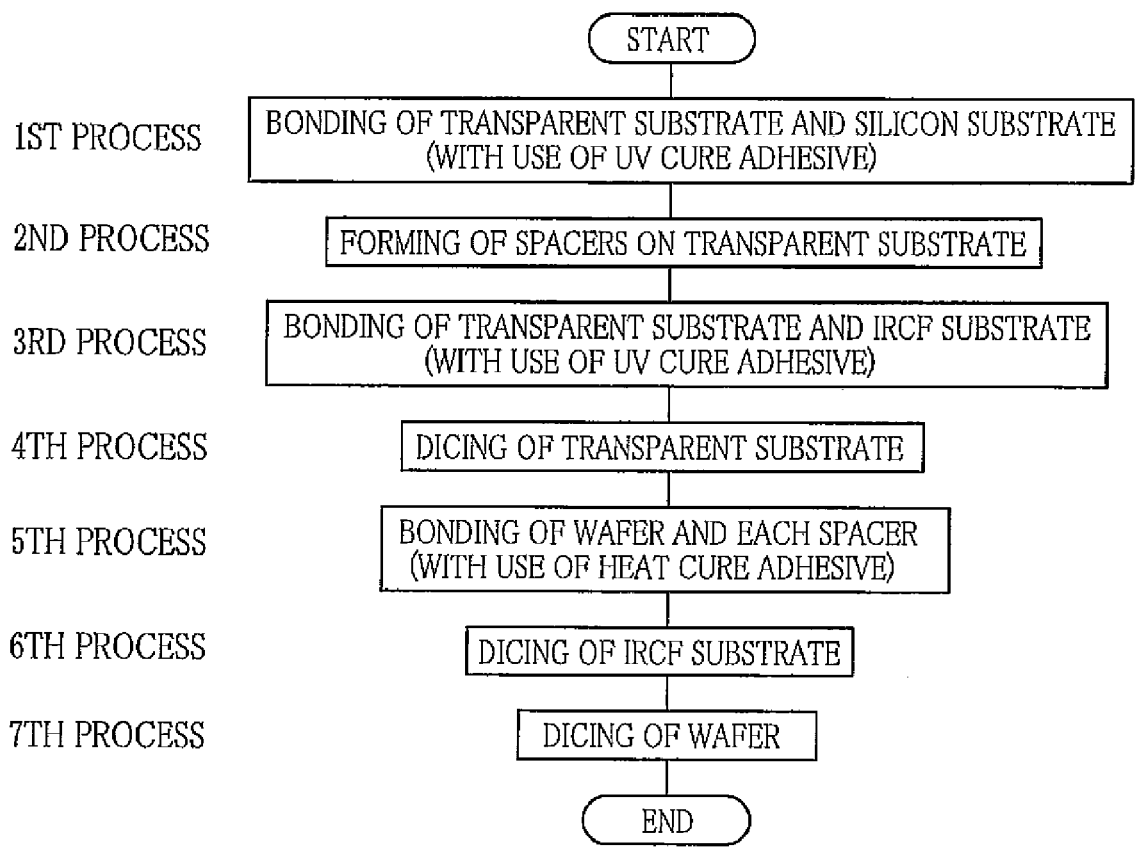
FIG. 3 is a flowchart showing manufacturing processes of the solid state imaging device.

Next, a manufacturing method of the solid state imaging device 2 of the present invention will be described with reference to flowcharts of FIG. 3 and FIG. 4, and cross-sectional views of FIG. 5A to FIG. 5G. As shown in FIG. 5A, at a first process, a silicon substrate 21 (material of the spacer 5) is bonded on a surface of a transparent substrate 20 (material of the cover glass 6). As stated above, the transparent substrate 20 is the low-α-ray glass having the coefficient of thermal expansion of approximately 6.7 ppm/° C. and the thickness of 500 μm, which is shaped to a circular disk whose outer diameter is 8 inches. The silicon substrate 21 has the coefficient of thermal expansion of 2 ppm/° C. to 4 ppm/° C. and the thickness of 100 μm, which is shaped to a circular disk whose outer diameter is 8 inches.

To join the transparent substrate 20 and the silicon substrate 21, an UV cure adhesive 24 is used. The UV cure adhesive 24 has for example viscosity of 400000 cps and Tg of 145° C. or viscosity of 127000 cps and Tg of 144° C., and is coated on the one surface of the transparent substrate 20 by a spin coat method or another method. By use of the UV cure adhesive having Tg of at least 120° C., the light receiving section 3 can be appropriately sealed even under a high temperature and high humidity condition.

The transparent substrate 20 and the silicon substrate 21 are joined under a vacuum environment so as to prevent that air bubbles enter into the joint surface. By vacuum pressure, the two substrates are in close contact with each other. After the junction, the UV cure adhesive 24 is fixed by UV light irradiated through the transparent substrate 20. Note that there is a problem that the silicon substrate 21 of the 100 μm thickness is somewhat difficult to handle and costly. Accordingly, it may be that a standard wafer having a certain thickness is attached to the transparent substrate 20 and then is thinned to 100 μm by backgrind.

Figure 5A:
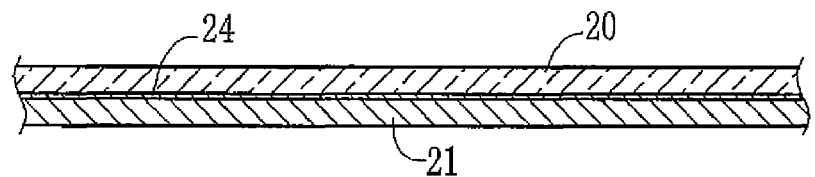
FIG. 5A is an explanatory view of the first process.
Figure 5B:
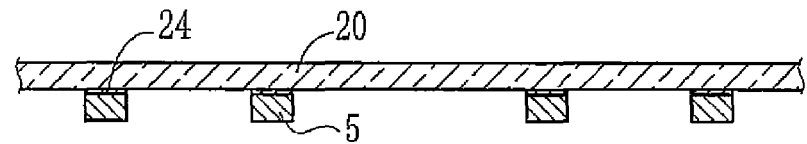
FIG. 5B is an explanatory view of the second process.

As shown in FIG. 5B, at a second process, the plural spacers 5 are formed from the silicon substrate 21. The formation of the spacers 5 is performed for example by a procedure described below. At first, resist is coated on the silicon substrate 21 by a spin coat method or another method, and the resist is prebaked. Next, a mask pattern of shape of the spacers 5 is exposed by a photolithography method, developed and hardbaked. After that, by anisotropic dry etching, the silicon substrate 21 is shaped into the plural spacers 5. The resist and the UV cure adhesive 24 remained on the spacer 5 are removed by $O_2$ ashing or chemical cleaning method.

Figure 5C:
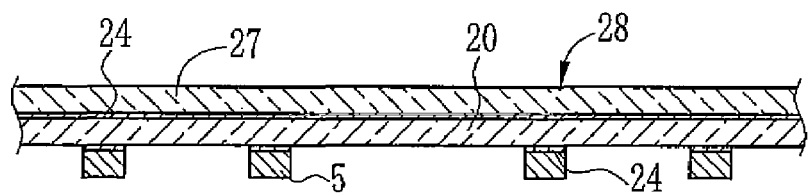
FIG. 5C is an explanatory view of the third process.

As shown in FIG. 5C, at a third process, an infrared cut filter substrate (hereinafter called as IRCF substrate) 27, which is a support substrate, is adhered to a surface of the transparent substrate 20 opposite to the surface with the spacers 5 formed thereon (spacer forming surface). Hereinafter, the unit of transparent substrate 20 with the spacers 5 and the IRCF substrate 27 joined together is called as a sealing substrate 28. As stated above, the IRCF substrate 27 has the coefficient of thermal expansion of approximately 4.5 ppm/° C. and the thickness of 500 μm. The shape of the IRCF substrate 27 is a circular disk whose outer diameter is 8 inches as same as the transparent substrate 20 and the silicon substrate 21, or a rectangular or polygon larger than the transparent substrate 20.

To join the transparent substrate 20 and the IRCF substrate 27, the UV cure adhesive 24 is used. The UV cure adhesive 24 is coated on the one surface of the IRCF substrate 27 by the spin coat method or another method. The transparent substrate 20 and the IRCF substrate 27 is joined under a vacuum environment so as to prevent that air bubbles enter into the joint surface. By vacuum pressure, the two substrates are in close contact with each other. After the junction, the UV cure adhesive 24 is fixed by UV light irradiated through the IRCF substrate 27.

Note that some kinds of the infrared cut filter do not transmit UV light. When such kind of infrared cut filter is used, a visible light cure adhesive can be used instead of the UV cure adhesive 24. In addition, since the junction between the transparent substrate 20 and the IRCF substrate 27 does not relate to sealing of the solid state imaging device 2, the adhesive is not required to have sealing property.

Figure 5D:
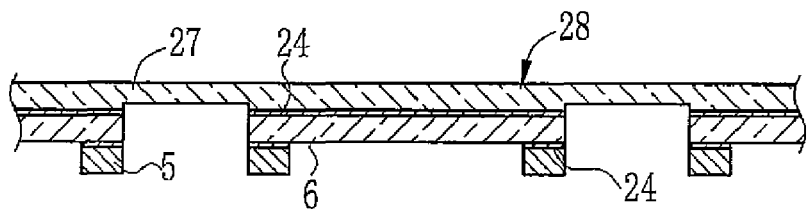
FIG. 5D is an explanatory view of the fourth process.

As shown in FIG. 5D, at a fourth process, the transparent substrate 20 is diced corresponding to the spacers 5 to form the plural cover glass, while the IRCF substrate 27 is not diced. Exactly, the transparent substrate 20 is diced along the outer peripheries of the spacers 5 from the spacer side of the sealing substrate 28. At this stage, also slight depth of cuts (for example 50 μm) is formed on the IRCF substrate 27 so that the diced transparent substrate 20 is surely detached from the sealing substrate 28.

Figure 4:
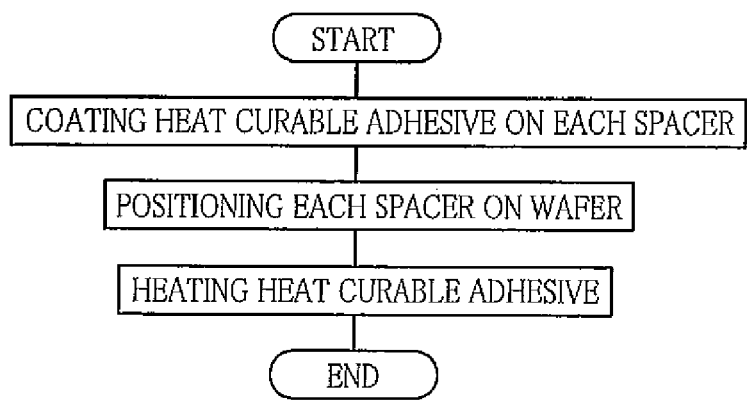
FIG. 4 is a flowchart showing procedures of the fifth process.
Figure 5E:
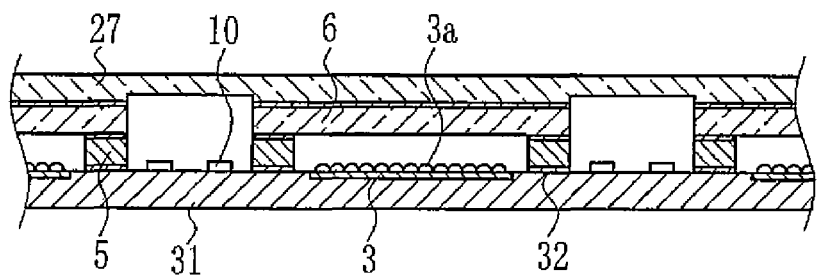
FIG. 5E is an explanatory view of the fifth process.

As shown in FIG. 4 and FIG. 5E, at a fifth process, the sealing substrate 28 is adhered on a wafer 31 on which the plurality of light receiving sections 3 and the pads 10 are formed. For this purpose, a heat cure adhesive 32, which has for example viscosity of 350000 cps, Tg of 196° C. and cure condition of 150° C. for 40 minutes, is used. To coat the heat cure adhesive 32 on the spacer 5, a transcribing method is used. At first, the heat cure adhesive 32 is spread thin and even on an elastic film of PET or the like. Next, the spacers 5 of the sealing substrate 28 are superimposed on the film and then the film is peeled off such that the heat cure adhesive 32 is transcribed on the spacers 5.

After that, alignment between the sealing substrate 28 and the wafer 31 is performed, the spacers 5 of the sealing substrate 28 are superimposed on the wafer 31, and the heat cure adhesive 32 is heated to be cured. By this heat, each component expands according to its coefficient of thermal expansion. However, the solid state imaging device 2 does not warp because the wafer 31 and the IRCF substrate 27 which function as supporting plates have the approximately same coefficient of thermal expansion. In addition, since the transparent substrate 20 has already been diced into the cover glasses 6, the expansion of each cover glass 6 does not cause the warpage of the IRCF substrate 27 and the wafer 31.

Accordingly, the joint of the components can be performed with high sealing property and without causing any problem in the solid state imaging device 2. Further, in the heat curing, the cure of the UV cure adhesive 24 between the cover glass 6 and the spacer 5 is also accelerated to enhance the sealing property. In addition, since the heat cure adhesive 32 has high glass transition point (Tg), it has superior sealing property and moisture blocking property at high temperatures. Since the heat cure adhesive 32 has low reactivity, current leak or other problems do not occur when being used on wiring patterns of the wafer 31. Since the heat cure adhesive 32 has high curing speed, the productivity of the solid state imaging device 2 is improved.

Figure 5F:
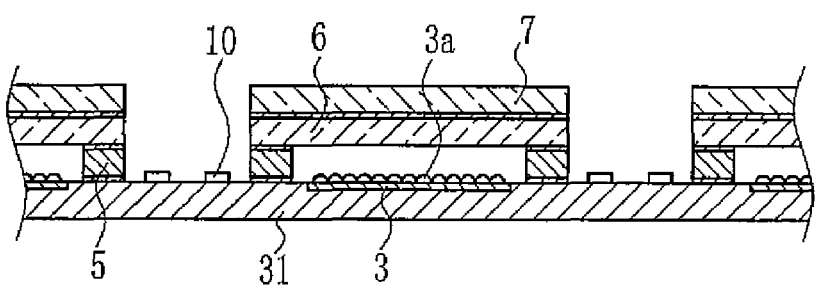
FIG. 5F is an explanatory view of the sixth process.
Figure 5G:
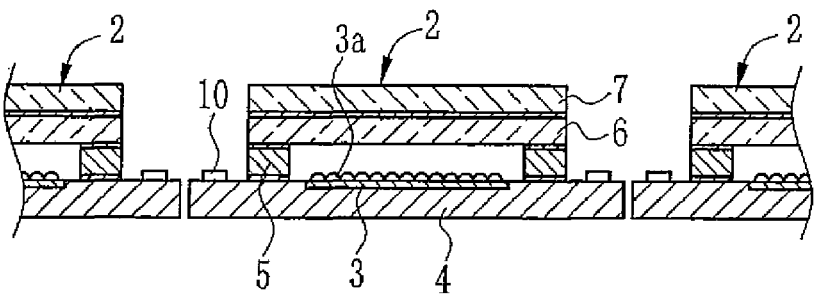
FIG. 5G is an explanatory view of the seventh process.

As shown in FIG. 5F, at a sixth process, the plurality of infrared cut filters 7 are formed by dicing of the IRCF substrate 27. Finally, as shown in FIG. 5G, at a seventh process, the wafer 31 is diced so that formation of the plurality of solid state imaging device 2 is completed. In this embodiment, since the transparent substrate 20 is diced preliminarily, there is sufficient clearance between the wafer 31 and a dicing blade at the dicing of the IRCF substrate 27. Accordingly, damage of the solid state imaging device 2 caused by glass shavings is reduced.

In the above embodiment, firstly the spacers 5 are formed on the transparent substrate 20 and then the IRCF substrate 27 as the support substrate is adhered to the transparent substrate 20. However, it may be possible that firstly the IRCF substrate 27 is adhered to the transparent substrate 20 and then the spacers 5 are formed. In the above embodiment, the IRCF substrate 27 is used as the support substrate. However, other filters usable for the solid state imaging device, such as an optical low pass filter and an anti-reflection filter, may be used as the support substrate. In addition, a transparent glass plate which does not obstruct the entering of light into the light receiving section 3 may be also used as the support substrate. In the above embodiment, the support substrate has the coefficient of thermal expansion smaller than the cover glass. However, when the coefficient of thermal expansion of the cover glass is small, a support substrate whose coefficient of thermal expansion is approximately same as the cover glass can be used.

In the above embodiment, the solid state imaging device has the support substrate remained on the cover glass. However, the support substrate can be removed from the cover glass after the spacer and the cover glass are joined to the wafer. For example, a general glass plate having low coefficient of thermal expansion is used as the support substrate, and the glass plate is adhered on the transparent substrate with use of a detachable adhesive. Thereafter, the transparent substrate is divided into pieces, and the transparent substrate with the spacer thereon is adhered to the wafer. After that, the glass plate is peeled off from the transparent substrate. As the detachable adhesive, for example there is adhesive which is cured by UV light and then swelled and detached by warm water.

INDUSTRIAL APPLICABILITY

The present invention is preferably applied to the solid state imaging device used for optical apparatuses such as digital cameras and cellular phones.

The invention claimed is:

1. A manufacturing method of a solid state imaging device comprising a process for separately sealing plural light receiving sections provided on a wafer and a process for dicing said wafer corresponding to said light receiving sections to make a plurality of image sensor chips, said process for separately sealing said plural light receiving sections including steps of:
   a process for forming plural spacers on one surface of a transparent substrate which is material of a cover glass, each said spacer corresponding to each said light receiving section;
   a process for joining at least one support substrate to another surface of said transparent substrate before or after said process for forming said spacers, said support substrate being material of optical plates and having coefficient of thermal expansion approximately the same as said wafer;
   a process for cutting off said transparent substrate on said support substrate such that portions corresponding to each said light receiving section are remained, so as to form a plurality of said cover glasses;
   a process for joining each said spacer to said wafer with use of a heat cure adhesive; and
   a process for dicing said support substrate corresponding to each said light receiving section, so as to form a plurality of said optical plates.

2. A manufacturing method of a solid state imaging device claimed in claim 1, wherein said process for joining each said spacer to said wafer having steps of:
   a process for coating each said spacer with said heat cure adhesive;
   a process for superimposing each said spacer on said wafer; and
   a process for heating to cure said heat cure adhesive.

3. A manufacturing method of a solid state imaging device claimed in claim 1, wherein said heat cure adhesive has a glass transition point of at least 120° C.

4. A manufacturing method of a solid state imaging device claimed in claim 1, wherein between said spacer and said transparent substrate, and between said transparent substrate and said support substrate are joined by an UV cure adhesive having a glass transition point of at least 120° C.

* * * * *